United States Patent
Kim

(10) Patent No.: US 7,645,176 B2
(45) Date of Patent: Jan. 12, 2010

(54) ORGANIC ELECTRO-LUMINESCENCE DISPLAY AND FABRICATING METHOD THEREOF

(75) Inventor: Ock-Hee Kim, Anayang-si (KR)

(73) Assignee: LG Display Co., Ltd., Seoul (KR)

( * ) Notice: Subject to any disclaimer, the term of this patent is extended or adjusted under 35 U.S.C. 154(b) by 195 days.

(21) Appl. No.: 12/007,558

(22) Filed: Jan. 11, 2008

(65) Prior Publication Data

US 2008/0113577 A1 May 15, 2008

Related U.S. Application Data

(62) Division of application No. 11/017,100, filed on Dec. 21, 2004, now Pat. No. 7,345,422.

(30) Foreign Application Priority Data

Dec. 26, 2003 (KR) .............................. 2003-097936

(51) Int. Cl.
*H01J 9/00* (2006.01)
(52) U.S. Cl. .......................................... 445/23; 445/25
(58) Field of Classification Search ............. 445/23–25
See application file for complete search history.

(56) References Cited

U.S. PATENT DOCUMENTS

| 6,175,345 B1 | 1/2001 | Kuribayashi et al. |
| 6,548,961 B2 | 4/2003 | Barth et al. |
| 2002/0158577 A1 | 10/2002 | Shimoda et al. |

FOREIGN PATENT DOCUMENTS

| JP | 2001-177509 | 4/2001 |
| KR | 2002-0047889 | 6/2002 |
| KR | 2004-0079476 | 9/2004 |
| WO | WO 01/62051 | 8/2001 |
| WO | WO 02/078101 | 10/2005 |

*Primary Examiner*—Joseph L Williams
(74) *Attorney, Agent, or Firm*—Morgan Lewis & Bockius LLP

(57) ABSTRACT

An organic electro-luminescence display (OELD) includes first and second substrates facing each other and having a display region and a non-display region, a first stacking layer in the display region, the first stacking layer including an array layer disposed on the first substrate and having a thin film transistor, a connection pattern connected with the array layer, and an emitting diode disposed on the second substrate and connected with the connection pattern, and a second stacking layer between the first and second substrates and in the non-display region, the second stacking layer corresponding to the first stacking layer.

13 Claims, 8 Drawing Sheets

ORGANIC ELECTRO-LUMINESCENCE DISPLAY AND FABRICATING METHOD THEREOF

This application is a Divisional of U.S. patent application Ser. No. 11/017,100, filed Dec. 21, 2004, now U.S. Pat. No. 7,345,422 and claims the benefit of Korean Patent Application No. 2003-0097936 filed in Korea on Dec. 26, 2003, both of which are hereby incorporated by reference in their entirety.

BACKGROUND OF THE INVENTION

1. Field of the Invention

The present invention relates to a display device, and more particularly, to an organic electro-luminescence display (OELD) and a fabricating method thereof.

2. Discussion of the Related Art

Until recently, display devices generally have employed cathode-ray tubes (CRTs). Presently, much effort has seen made to study and develop various types of flat panel displays, such as liquid crystal display devices (LCDs), plasma display panels (PDPs), field emission displays, and organic electro-luminescence displays (OELDs), as substitutes for CRTs. Among these flat panel displays, the PDP has a large display size but low lightness and high power consumption. The LCD has thin profile and low power consumption, but a small display size. The OELD is a luminescent display that has fast response time, high lightness and wide viewing angle.

FIG. 1 is a view of an equivalent circuit for an OELD according to the related art. As shown in FIG. 1, the OELD includes a data line DL and a gate line GL crossing each other to define a pixel region P, and a power line VDDL. In the pixel region P, a switching transistor $T_S$, a driving transistor $T_D$, a storage capacitor $C_{ST}$ and an organic emitting diode E are arranged. The switching transistor $T_S$ turns on or off by a gate signal applied through the gate line GL. When the switching transistor $T_S$ turns on, a data signal is applied to the driving transistor $T_D$ through the data line DL. The driving transistor $T_D$ turns on or off by the applied data signal. When the driving transistor $T_D$ turns on, a power signal is applied to the organic emitting diode E through the power line VDDL so that the organic emitting diode E emits light.

FIG. 2 is a cross-sectional view of an OELD according to the related art. As shown in FIG. 2, the OELD includes a first substrate 70 as a lower substrate, and a second substrate 90 as an encapsulation substrate facing the first substrate 70. Also, on the first substrate 70, an array layer AL and an organic emitting diode E on the array layer AL are disposed. The array layer Al includes a transistor T. The organic emitting diode E includes a first electrode 72, an organic emitting layer 74, and a second electrode 76. Since the first electrode 72 is made of a transparent material, light emitted from the organic emitting layer 74 goes toward the first substrate 70. On the other hand, the second substrate 90 has a sunken portion 92 filled with a desiccant 94. The desiccant 94 blocks outer moisture so as to protect the organic emitting diode E.

The OELD of FIG. 2 is regarded as a bottom emission type OELD because of its light emission direction. In this bottom emission type OELD, since the array layer AL and the organic emitting diode E are both formed on the lower substrate 70 as light-emitting elements, if either one has a problem, the lower substrate 70 is considered as a defective substrate, thereby reducing the production efficiency of the OELD. Moreover, in the bottom emission type OELD, since elements such as the transistor and metal lines blocks light emission from the bottom, the aperture ratio of the OELD is small, thereby causing difficulty to achieve high resolution.

SUMMARY OF THE INVENTION

Accordingly, the present invention is directed to an organic electro-luminescence display and a fabricating method thereof that substantially obviate one or more of problems due to limitations and disadvantages of the related art.

An object of the present invention is to provide an organic electro-luminescence display that is capable of improving production efficiency and increasing aperture ratio, thereby achieving high resolution.

Another object of the present invention is to provide a method of fabricating an organic electro-luminescence display that is capable of improving production efficiency and increasing aperture ratio, thereby achieving high resolution.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the organic electro-luminescence display (OELD) includes a first substrate and a second substrate that face each other and include a display region and a non-display region, a first stacking layer in the display region, the first stacking layer including an array layer disposed on the first substrate and having a thin film transistor, a connection pattern connected with the array layer, and an emitting diode disposed on the second substrate and connected with the connection pattern, and a second stacking layer between the first and second substrates and in the non-display region, the second stacking layer structurally corresponding to the first stacking layer.

In another aspect of the present invention, the fabricating method of an organic electro-luminescence display (OELD) includes preparing a first substrate and a second substrate that having a display region and a non-display region, forming a first stacking layer and a second stacking layer on the first substrate, wherein the first stacking layer is disposed in the display region and includes an array layer having a thin film transistor on a first substrate and a connection pattern connected with the array layer, and the second stacking layer is disposed in the non-display region, forming a third stacking layer and a fourth stacking layer on the second substrate, wherein the third stacking layer is disposed in the display region and includes an emitting diode connected with the connection pattern, and the fourth stacking layer is disposed in the non-display region, and attaching the first and second substrates, the first stacking layers structurally corresponding to the second stacking layer and the third stacking layer structurally corresponding to the fourth stacking layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
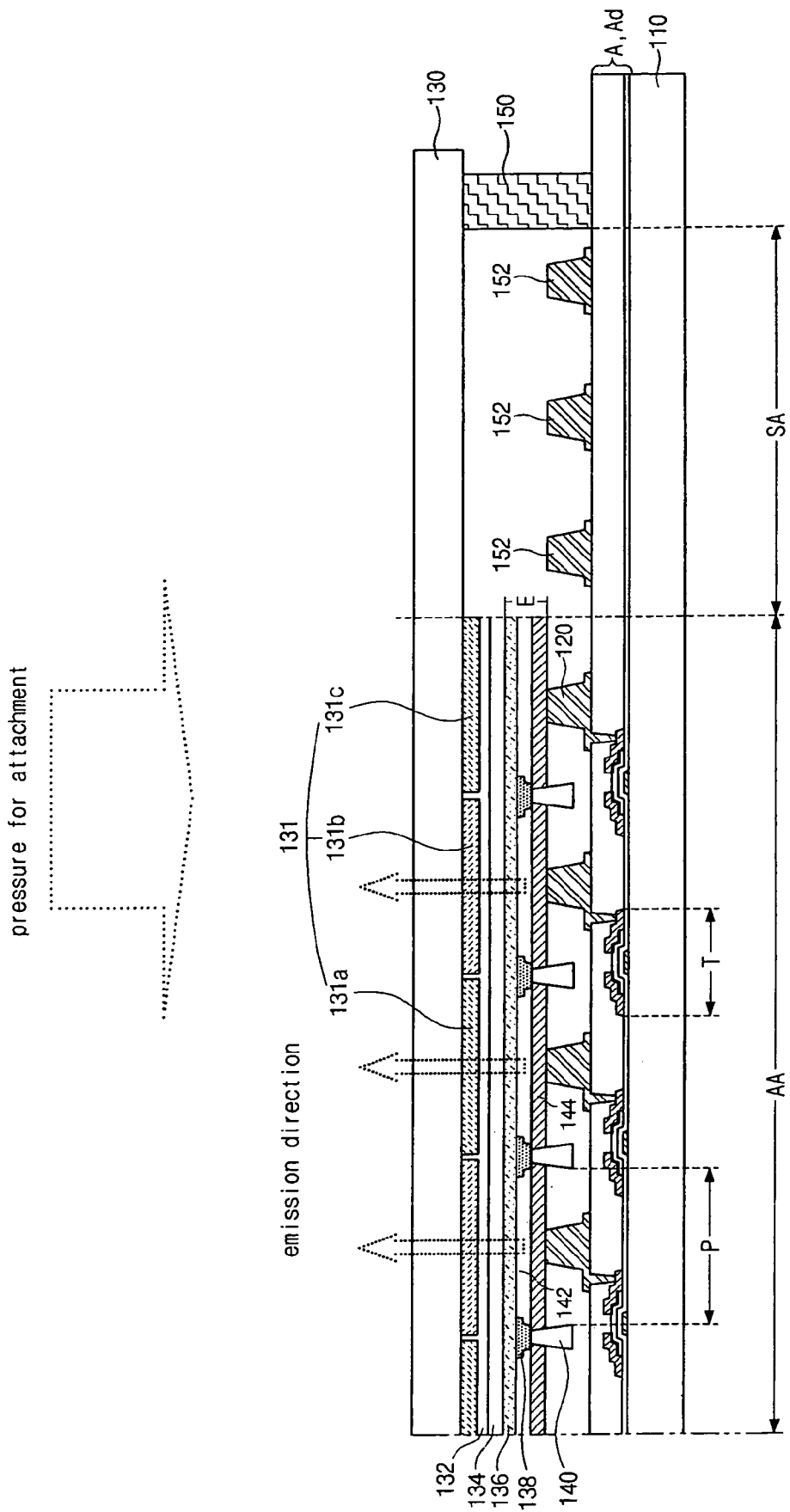
FIG. 3 is a cross-sectional view of an organic electroluminescence display (OELD) according to a first embodiment of the present invention.

FIG. 3 is a cross-sectional view of an organic electroluminescence display (OELD) according to a first embodiment of the present invention. As shown in FIG. 3, the OELD includes a first substrate 110 as a lower substrate, and a second substrate as an upper substrate facing the first substrate 110. Also, the OELD includes a display region AA and a non-display region SA at a periphery portion of the display region AA.

Figure 1:
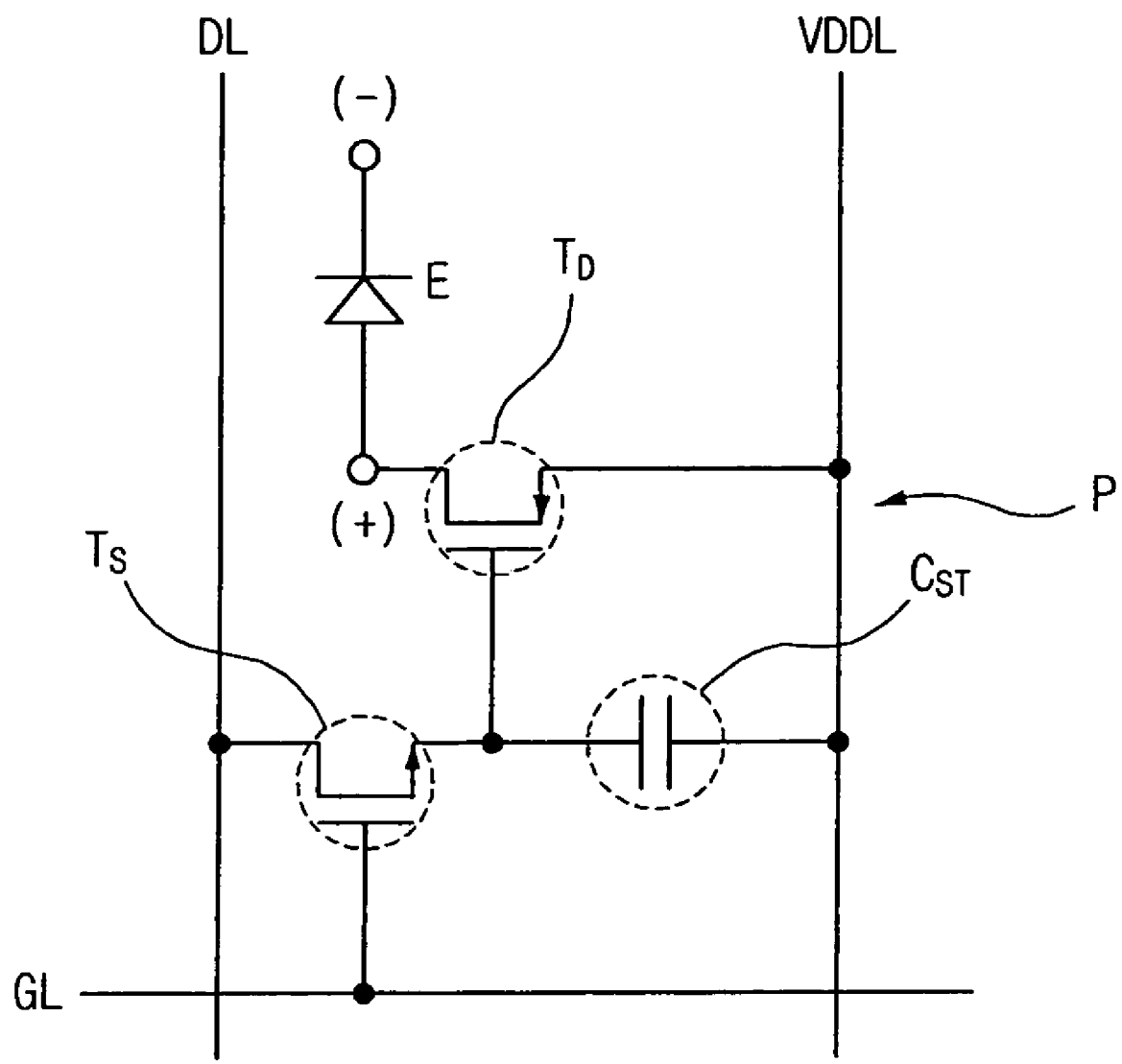
FIG. 1 is a view of an equivalent circuit for an organic electro-luminescence display (OELD) according to the related art.
Figure 2:
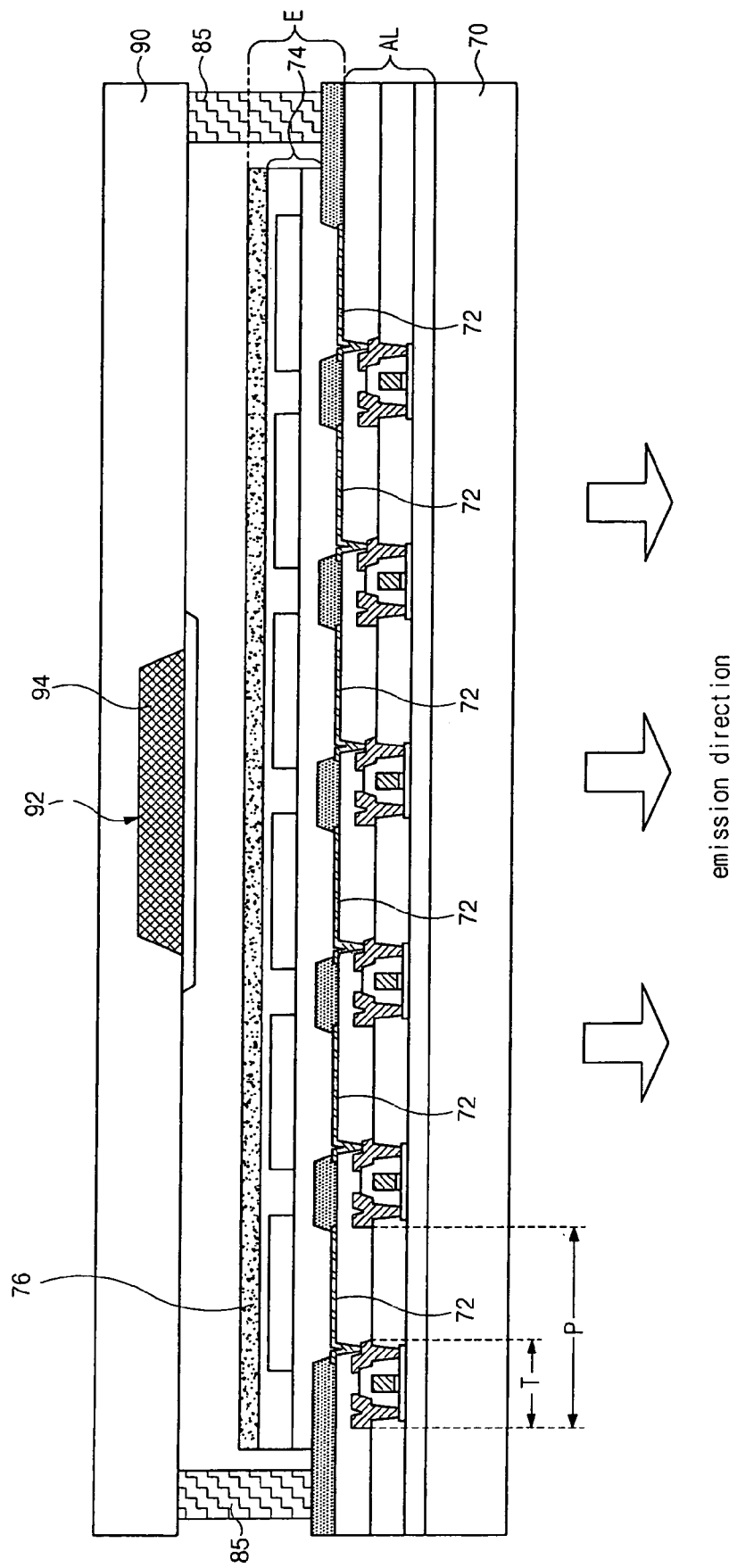
FIG. 2 is a cross-sectional view of an OELD according to the related art.

In the display region AA, an array layer A including a thin film transistor T in a pixel region P, and a connection pattern 120 connected with the transistor T are disposed on an inner surface of the first substrate 110. Even though not shown in the drawings, a gate line and a data line crossing each other to define the pixel region P are disposed in the array layer A. The transistor T is a driving transistor $T_D$ as shown in FIG. 1. The connection pattern 120 may include multiple layers and an insulating material.

In the display region AA, color filter patterns 131, a planarization layer 132, and a barrier layer 134 are subsequently disposed on an inner surface of the second substrate 130. The color filter patterns 131 may include red, green and blue color filter patterns 131a, 131b and 131c, which may be made of red, green, blue color resins, respectively. Even though not shown in the drawings, a black matrix may be disposed between the adjacent color filter patterns 131. The planarization layer 132 planarizes the second substrate 130 having the color filter patterns 131. The barrier layer 134 prevents the color filter patterns 131 from outgassing and stabilizes elements deposited thereon.

A first electrode 136 is deposited on the barrier layer 134. On the first electrode 136, a buffer pattern 138 is arranged between the adjacent pixel regions P. A separator 140 is disposed on the buffer pattern 138, and has a reverse taper structure such that width of the separator 140 gets wider as distance from the buffer pattern 138 gets further. An organic emitting layer 142, and a second electrode 144 on the organic emitting layer 142 are arranged between adjacent separators 140 and corresponding to the pixel region P.

The first and second electrodes 136 and 144, and the organic emitting layer 142 constitute an organic emitting diode E. The first electrode 136 as an anode may be made of a transparent conductive material such as indium-tin-oxide (ITO), indium-zinc-oxide (IZO) or the like. The second electrode 144 as a cathode may be made of an opaque conductive material or the like. The organic emitting layer 142 may be made of a material emitting white color due to using the color filter patterns 131 to display color images. The buffer pattern 138 separates the first and second electrodes 136 and 144 from each other. Since the first electrode 136 is made of a transparent material, a light emitted from the organic emitting layer 142 goes toward the second substrate 130. Accordingly, the OELD of FIG. 3 is defined as a top emission type OELD due to the light emission direction.

In addition, as shown in FIG. 3, the transistor T on the first substrate 110 and the second electrode 144 on the second substrate 130 are connected through the connection pattern 120, and thus, a signal is supplied to the second electrode 144. At a periphery portion of the OELD, a sealant 150 is disposed to attach the first and second substrates 110 and 130.

In the non-display region SA, a dummy array layer Ad, a spacer 152 on the dummy array layer Ad is disposed on the inner surface of the first substrate 110. The dummy array layer Ad may not have elements such as the transistor T and metal lines, and preferably is designed to have the same thickness as the array layer A. The spacer 152 may be also designed to have the same shape and thickness as the connection pattern 120, thereby preventing the second substrate 130 from warping.

In this exemplary embodiment, the array layer and the organic emitting diode are respectively formed on the different substrates. Such an arrangement can increase the production efficiency of the OELD. Further, in the top emission type OELD, the light emitted from the organic emitting layer goes toward the upper substrate facing the lower substrate, where the transistor and metal lines blocking light emission are disposed. Such an arrangement can increase the aperture ratio of the OELD, thereby achieving the high resolution.

Figure 4:
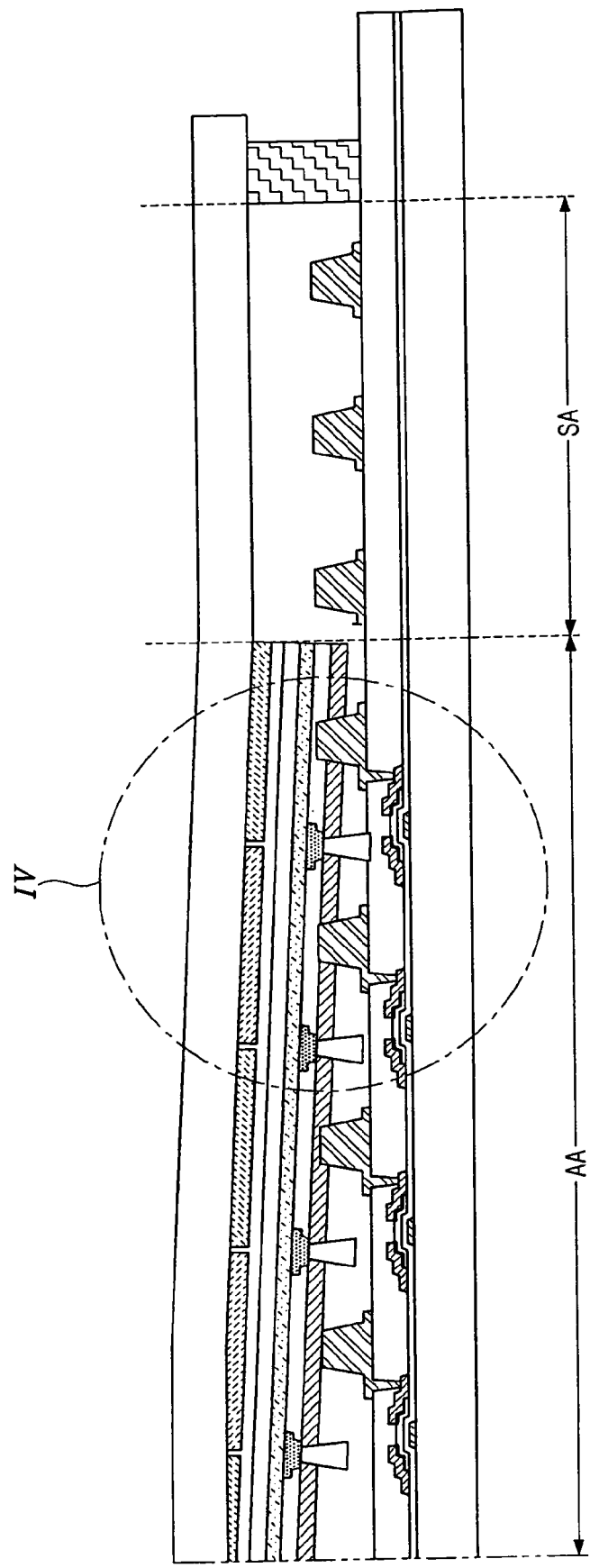
FIG. 4 is a cross-sectional view of a warped OELD according to the first embodiment when pressure for attachment is applied.

However, as shown in FIG. 3, stacking structures in the display region and in the non-display region are different from each other. In other words, in the non-display region, only the spacer having a similar shape to the connection pattern is stacked, but other patterns such as the organic emitting diode is not stacked. Accordingly, as shown in FIG. 4, stacking structure in the non-display region SA may have a thickness thinner than that of the display region AA. As a result, when the two substrates are attached, in a portion IV near the non-display region SA, the warping of the upper substrate may happen. Moreover, in the portion IV, since pressure for attachment may be higher than that in other portion of the display region AA, misalignment and defects of stacking layers may happen.

Figure 5:
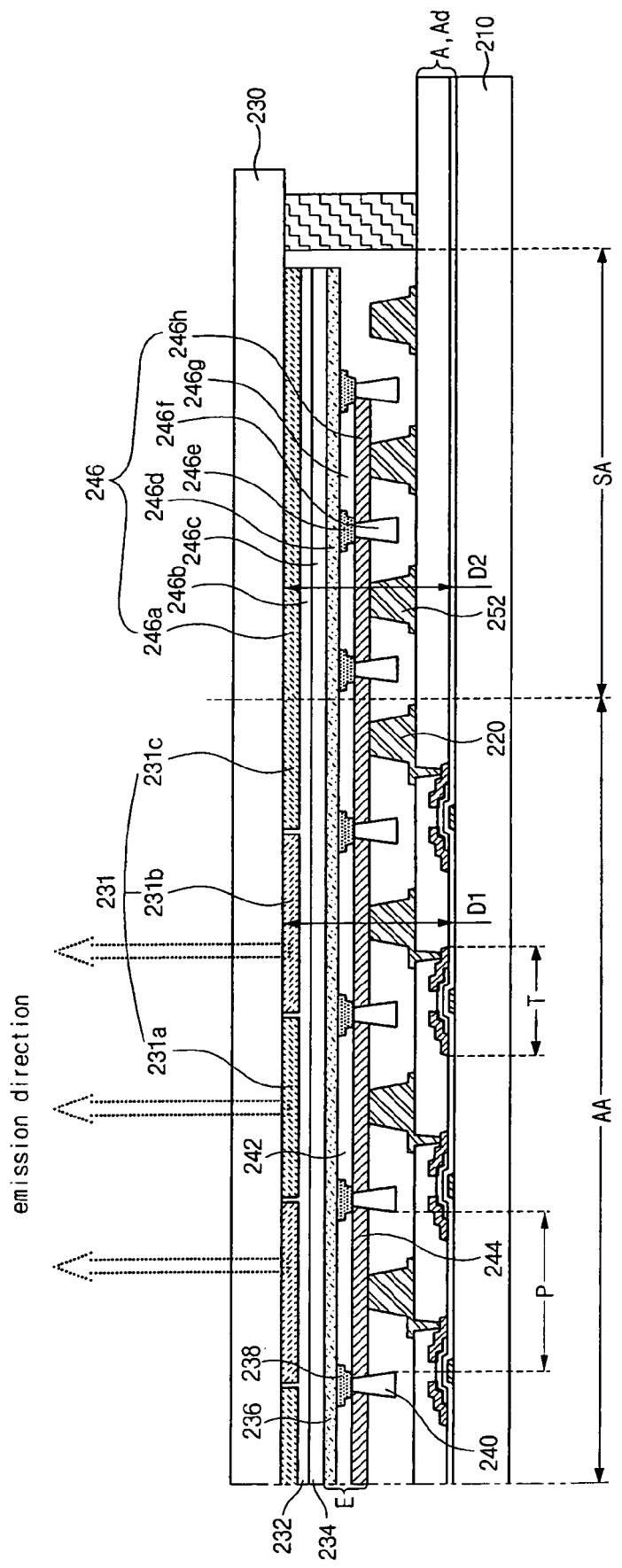
FIG. 5 is a cross-sectional view of an OELD according to a second embodiment of the present invention.

Next, a second embodiment of an OELD will be described as an improvement of the first embodiment as shown in FIGS. 3 and 4. FIG. 5 is a cross-sectional view of an OELD according to the second embodiment of the present invention. Explanations of the similar parts to the first embodiment will be omitted. The OELD in FIG. 5 is similar to that in FIG. 3, except for stacking structure in the non-display region SA.

As shown in FIG. 5, a stacking structure in the display region AA is similar to that in FIG. 3. Also, like the dummy array layer Ad and the spacer 152 in FIG. 3, in the non-display region SA, a dummy array layer Ad and a spacer 252 are disposed on an inner surface of a first substrate 210. Further, in the non-display region SA, a dummy layer 246 is disposed on an inner surface of a second substrate 230. The dummy layer 246 includes a dummy color filter pattern 246a, a dummy planarization layer 246b, a dummy barrier layer 246c, a dummy first electrode 246d, a dummy buffer pattern 246e, a dummy separator 246f, a dummy organic emitting layer 246g and a dummy second electrode 246h, which correspond to a color filter pattern 231, a planarization layer 232, a barrier layer 234, a first electrode 236, a buffer pattern 238, a separator 240, a organic emitting layer 242 and a second electrode 244, respectively. The dummy color filter pattern 246a, the dummy planarization layer 246b, the dummy barrier layer 246c and the dummy first electrode 246d are extended from and have the same thickness as the color filter pattern 231, the planarization layer 232, the barrier layer 234 and the first electrode 236, respectively. The dummy buffer pattern 246e, the dummy separator 246f, the dummy organic emitting layer 246g and the dummy second electrode 246h have the same shape and thickness as the buffer pattern 238, the separator 240, the organic emitting layer 242 and the second electrode 244, respectively.

Thus, the thickness of stacking layers D2 in the non-display region SA is equal to that of stacking layers D1 in the display region AA. When the two substrates are attached, in a portion near the non-display region SA, the warping of the substrates can be prevented. Further, in the portion near the non-display region, misalignment and defects of stacking layers can also be prevented. Furthermore, since the dummy layers in the non-display region are formed in the same step of forming the corresponding layers in the display region, no separate processes are needed to form the dummy layers.

Figure 6:
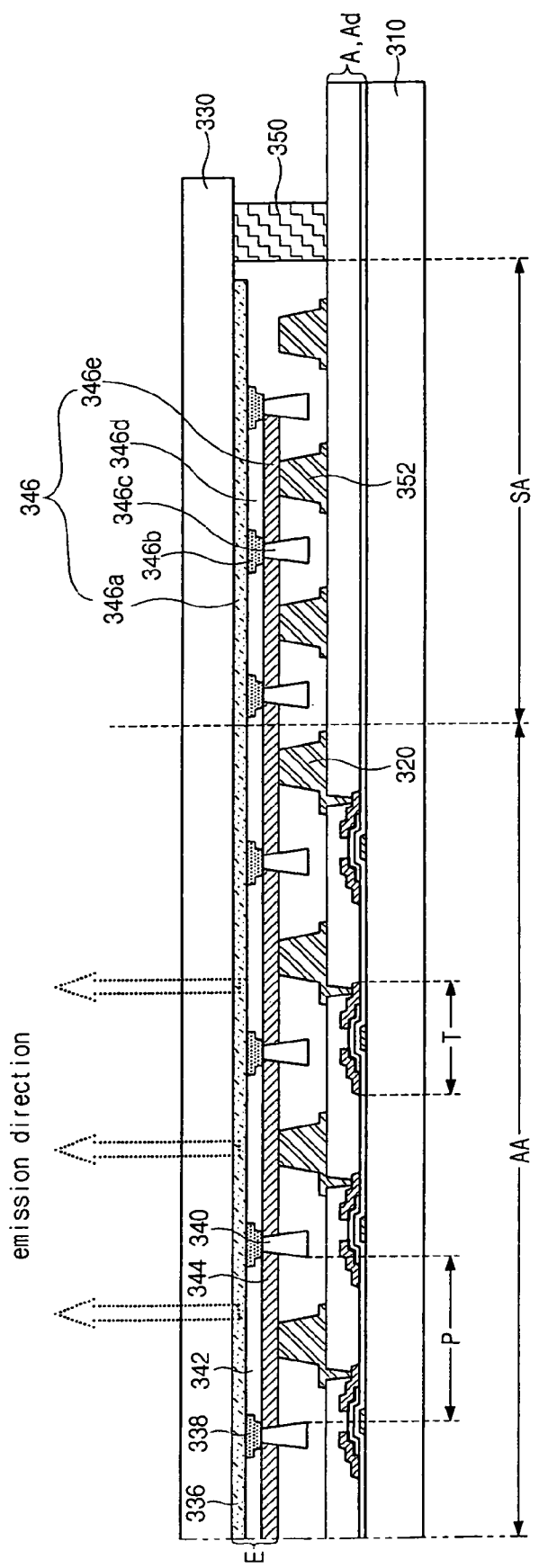
FIG. 6 is a cross-sectional view of an OELD according to a third embodiment of the present invention.

FIG. 6 is a cross-sectional view of an OELD according to a third embodiment of the present invention. In the third embodiment, explanations of the similar parts to the second embodiment will be omitted. The OELD in FIG. 6 is similar to that in FIG. 5, except for the color filter pattern. As shown in FIG. 6, in the display region AA, the OELD does not include the color filter pattern 231, the planarization layer 232 and the barrier layer 234 in FIG. 5. Accordingly, in the display region AA, a first electrode 336, a buffer pattern 338, a separator 340, an organic emitting layer 342 and a second electrode 344 are disposed on an inner surface of a second substrate 330.

Unlike the non-display region SA of FIG. 5, in the non-display region SA of FIG. 6, a dummy layer 346 including a dummy first electrode 346a, a dummy buffer pattern 346b, a dummy separator 346c, a dummy organic emitting layer 346d and a dummy second electrode 346e is disposed on the inner surface of the second substrate 330. Also, instead of the color filter patterns 231 in FIG. 5, an organic emitting layer 342 serves to display color. The organic emitting layers 342 in respective pixel regions P may emit red, green and blue colors to display natural color images toward the second substrate 330.

Figure 7:
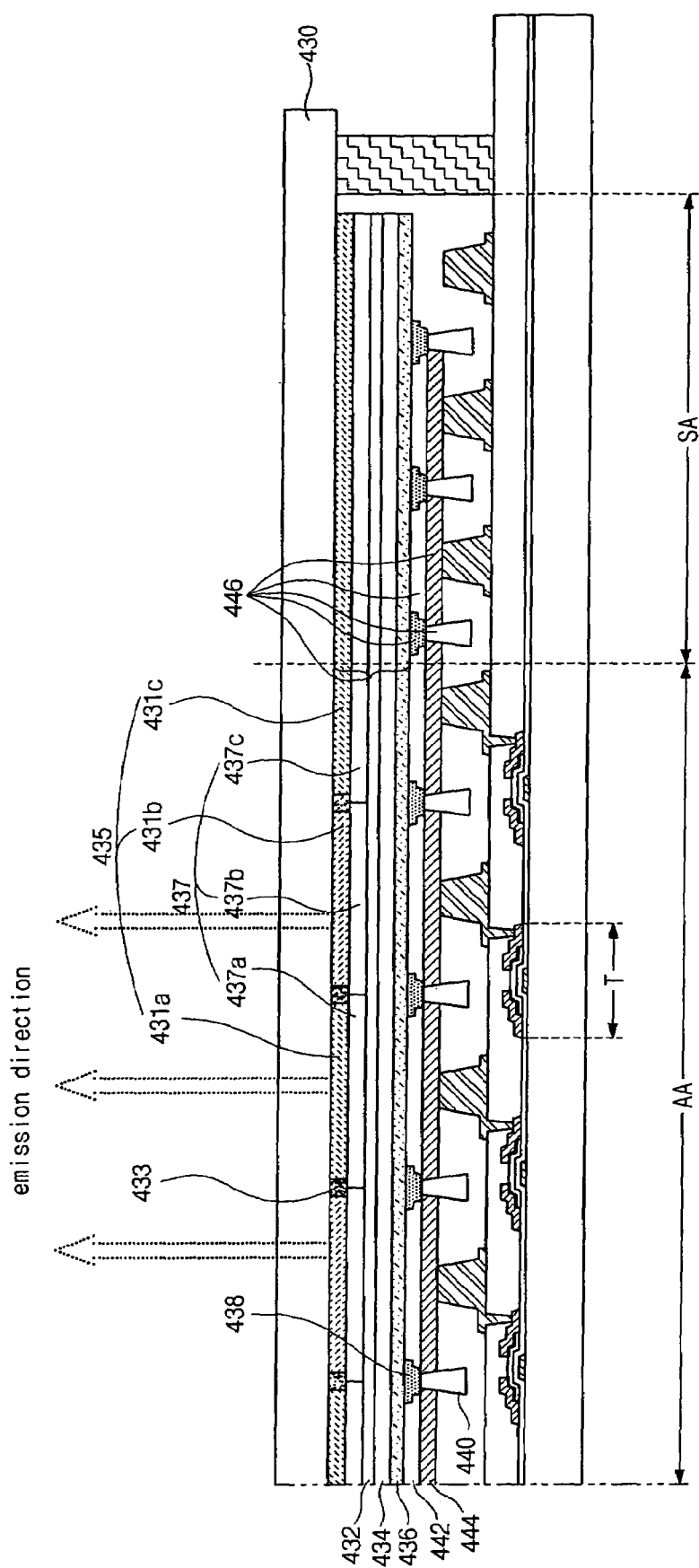
FIG. 7 is a cross-sectional view of an OELD according to a fourth embodiment of the present invention.

FIG. 7 is a cross-sectional view of an OELD according to a fourth embodiment of the present invention. In the fourth embodiment, explanations of the similar parts to the second embodiment will be omitted. The OELD in FIG. 7 is similar to that in FIG. 5, and further includes color changing medium (CCM) patterns 437.

In the display region AA, color filter patterns 431 are disposed on an inner surface of a second substrate 430, and the CCM patterns 437 are disposed on the color filter patterns 431. The CCM patterns 437 include red, green and blue CCM patterns 437a, 437b and 437c, which correspond to red, green and blue color filter patterns 431a, 431b and 431c, respectively. A black matrix 433 may be disposed between the adjacent color filter patterns 431. On the CCM patterns 437, a planarization layer 432, a barrier layer 434, a first electrode 436, a buffer pattern 438, a separator 440, an organic emitting layer 442 and a second electrode 444 are disposed. In the fourth embodiment, since the CCM patterns 437 are employed, the organic emitting layer 442 may emit a blue color, more particularly, a sky blue color or a greenish blue color.

In the non-display region SA, a dummy layer 446 further includes a dummy CCM pattern between a dummy color filter pattern and a dummy planarization layer. The dummy CCM pattern is extended from the CCM pattern 437.

Figure 8:
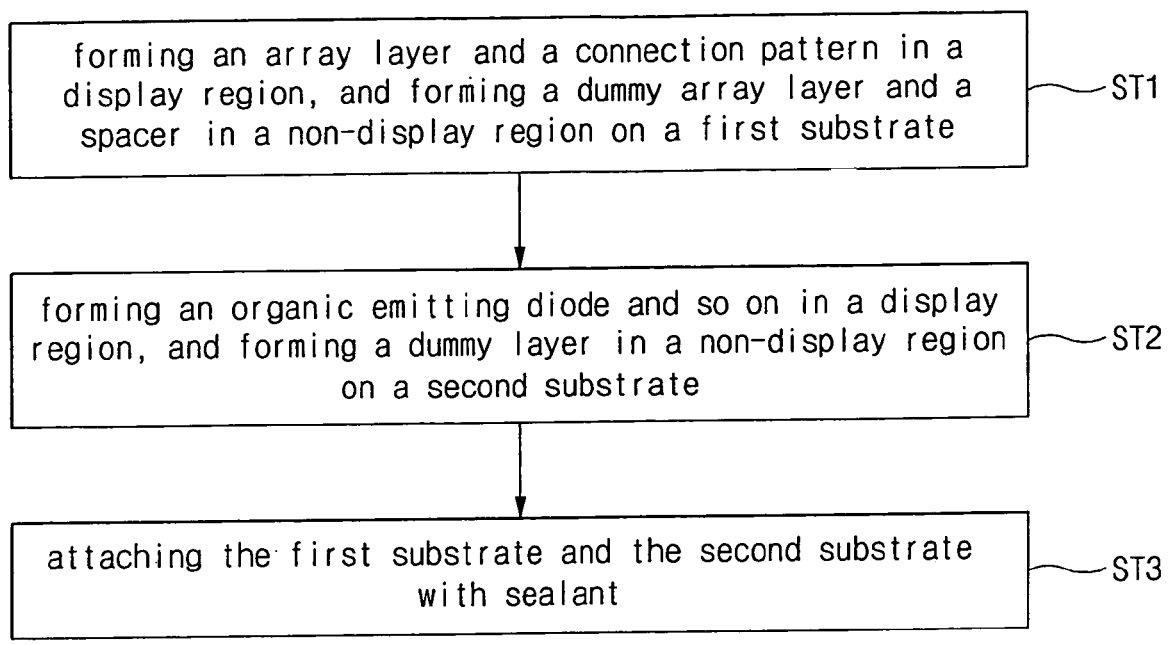
FIG. 8 is a flow chart of fabricating method of an OELD according to a fifth embodiment of the present invention.

FIG. 8 is a flow chart of a fabricating method of an OELD according to a fifth embodiment of the present invention. The fabricating method according to the fifth embodiment is a method of fabricating an OELD according to the first to fourth exemplary embodiments. As shown in FIG. 8, the fabricating method includes first, second and third steps ST1, ST2 and ST3.

In the first step ST1, an array layer including a transistor and metal lines and a connection pattern in a display region, and a dummy array layer and a spacer in a non-display region are formed on an inner surface of a first substrate as a lower substrate.

In the second step ST2, an organic emitting diode including first and second electrodes, and an organic emitting layer, a buffer pattern and a separator in the display region are formed on an inner surface of a second substrate as an upper substrate. Moreover, stacking layers corresponding to each of the first to fourth exemplary embodiments may be formed. For example, regarding to the second embodiment, color filter patterns, a planarization layer and a barrier layer may be formed in the display region, and a dummy layer may be formed in the non-display region.

The fifth embodiment is not limited to the order of the above steps ST1 and ST2. That is, the first step ST1 may follow the second step ST2, or the first and second steps ST1 and ST2 may progress at the same time.

In the third step ST3, the first substrate fabricated in the first step ST1 and the second substrate fabricated in the second step ST2 are attached using a sealant. Even though pressure is applied in the attachment process of the two substrates, the dummy structure of the OELD can prevent the OELD from warping.

It will be apparent to those skilled in the art that various modifications and variations can be made in the organic electro-luminescence display and a method of fabricating the display of the present invention without departing from the spirit or scope of the invention. Thus, it is intended that the present invention cover the modifications and variations of this invention provided they come within the scope of the appended claims and their equivalents.

What is claimed is:

1. A fabricating method of an organic electro-luminescence display (OELD), comprising:
    preparing a first substrate and a second substrate that have a display region and a non-display reason;
    forming a first stacking layer and a second stacking layer on the first substrate, wherein the first stacking layer is disposed in the display region and includes an array layer having a thin film transistor and a connection pattern connected with the array layer, and the second stacking layer is disposed in the non-display region;
    forming a third stacking layer and a fourth stacking layer on the second substrate, wherein the third stacking layer is disposed in the display region and includes an emitting diode connected with the connection pattern, and the fourth stacking layer is disposed in the non-display region; and attaching the first substrate and the second substrate, the first stacking layer structurally corresponding to the second stacking layer and the third stacking layer structurally corresponding to the fourth stacking layer.

2. The method according to claim 1, wherein forming the third stacking layer further includes forming a color filter pattern between the second substrate and the emitting diode.

3. The method according to claim 2, wherein forming the third stacking layer further includes forming a planarization layer on the color filter layer, and a barrier layer between the planarization layer and the emitting diode.

4. The method according to claim 2, wherein forming the third stacking layer further includes forming a color changing medium (CCM) pattern between the color filter pattern and the emitting diode.

5. The method according to claim 1, wherein forming the third stacking layer further includes forming a buffer pattern and a separator on the buffer pattern, and wherein the buffer pattern and the separator are formed between the adjacent emitting diodes.

6. The method according to claim 1, wherein forming the second stacking layer includes forming a dummy array layer on the first substrate and a spacer on the dummy array layer, and forming the fourth stacking layer includes forming a dummy emitting diode on the second substrate, and wherein the dummy array layer, the spacer and the dummy emitting diode respectively correspond to the array layer, the connection pattern and the emitting diode.

7. The method according to claim 2, wherein forming the second stacking layer includes forming a dummy array layer on the first substrate and a spacer on the dummy array layer, and forming the fourth stacking layer includes forming a dummy color filter pattern on the second substrate, and the dummy emitting diode on the dummy color filter pattern, and wherein the dummy array layer, the spacer, the dummy color filter pattern and the dummy emitting diode respectively correspond to the array layer, the connection pattern, the color filter pattern and the emitting diode.

8. The method according to claim 3, wherein forming the second stacking layer includes forming a dummy array layer on the first substrate and a spacer on the dummy array layer, and forming the fourth stacking layer includes forming a dummy color filter pattern on the second substrate, a dummy planarization layer on the dummy color filter pattern, a dummy barrier layer on the dummy planarization layer, and the dummy emitting diode on the dummy barrier layer, and wherein the dummy array layer, the spacer, the dummy color filter pattern, the dummy planarization layer, the dummy barrier layer and the dummy emitting diode respectively correspond to the array layer, the connection pattern, the color filter pattern, the planarization layer, the barrier layer and the emitting diode.

9. The method according to claim 4, wherein forming the second stacking layer includes forming a dummy array layer on the first substrate and a spacer on the dummy array layer, and forming the fourth stacking layer includes forming a dummy color filter pattern on the second substrate, a dummy CCM pattern on the dummy color filter pattern, and the dummy emitting diode on the dummy CCM pattern, and wherein the dummy array layer, the spacer, the dummy color filter pattern, the dummy CCM pattern and the dummy emitting diode respectively correspond to the array layer, the connection pattern, the color filter pattern, the CCM pattern and the emitting diode.

10. The method according to claim 5, wherein forming the second stacking layer includes forming a dummy array layer on the first substrate and a spacer on the dummy array layer, and forming the fourth stacking layer includes forming a dummy emitting diode on the second substrate, a dummy buffer pattern between the adjacent dummy emitting diodes and a dummy separator on the dummy buffer pattern, and wherein the dummy array layer, the spacer, the dummy emitting diode, the dummy buffer pattern and the dummy separator respectively correspond to the array layer, the connection pattern and the emitting diode, the buffer pattern and the separator.

11. The method according to claim 1, wherein the first stacking layer has substantially the same thickness as the second stacking layer, and the third stacking layer has substantially the same thickness as the fourth stacking layer.

12. The method according to claim 1, wherein forming the emitting diode includes forming a first electrode on the second substrate, an organic emitting layer on the first electrode, and a second electrode on the organic emitting layer.

13. The method according to claim 12, wherein the first electrode includes a transparent conductive material.

* * * * *